Jan. 9, 1962 F. F. LEE 3,016,422
REVERSIBLE CODE CONVERTER
Filed Nov. 29, 1957
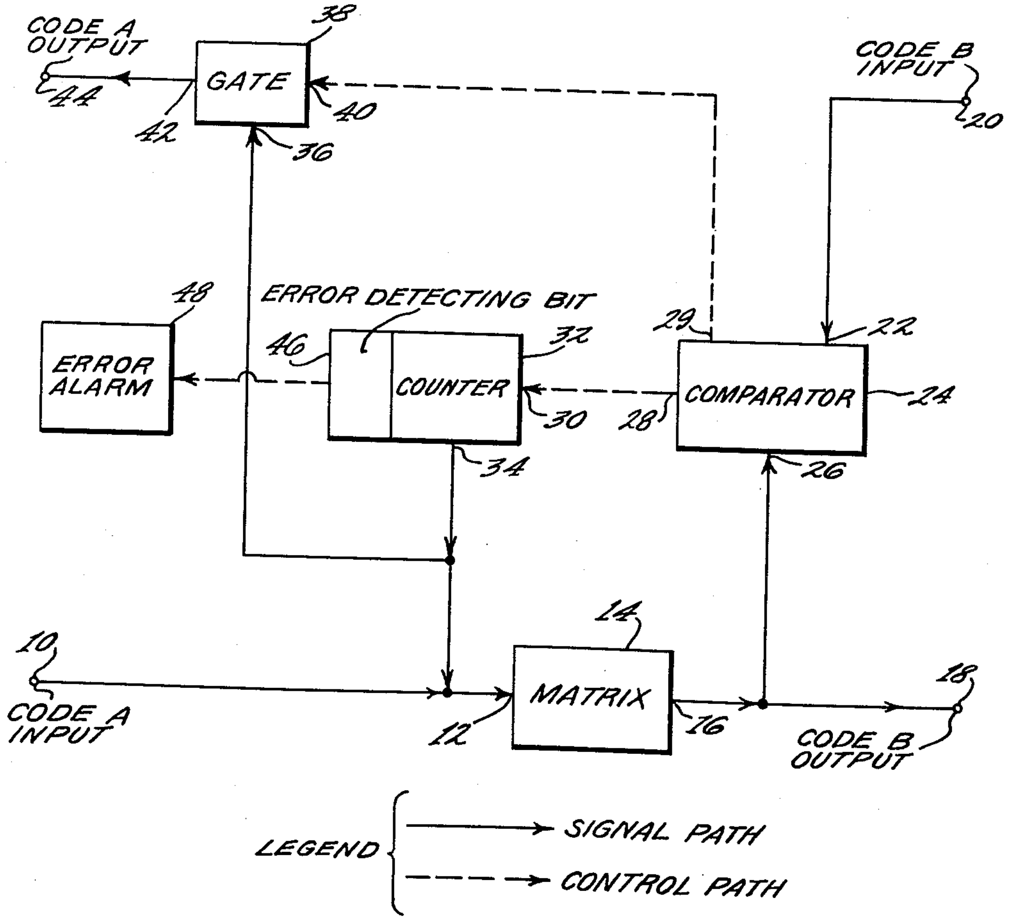
INVENTOR.
Francis F. Lee
BY Morris A. Pakkin
ATTORNEY.

United States Patent Office 3,016,422

Patented Jan. 9, 1962

3,016,422

REVERSIBLE CODE CONVERTER

Francis F. Lee, Norristown, Pa., assignor to Radio Corporation of America, a corporation of Delaware Filed Nov. 29, 1957, Ser. No. 699,685
8 Claims. (Cl. 178—26)

This invention relates to code converters, and in particular relates to a reversible code converter for converting from one fixed length code to another fixed length code.

Various computer equipment make use of a fixed length code in which a predetermined number of "bits" are allotted to each transmitted character. A "bit" is a binary digit of information. An example of a fixed length code is the five unit code used in various computer and printer circuitries; a seven element code is often used in telegraphic and computer circuitry. Extra digits may be used for error checking or other purposes.

Because of the extensive use of five and seven unit equipment, it is advantageous to use a device for quickly, economically, and accurately converting from one code to the other. One such reversible code translator is described by A. E. Canfora in U.S. Patent 2,744,955, patented May 8, 1956, entitled Reversible Electronic Code Translators. The present invention, however, is highly flexible for application to a number of systems without extensive modification, and makes use of circuitry available in most computers without the necessity for additional components.

An object of this invention, therefore, is to convert a signal expressed in a given fixed length code, to the corresponding signal, expressed in any other fixed length code, by improved electronic means.

A further object of this invention is to provide a simplified reversible code converter which converts characters expressed in one fixed length code into another fixed length code in an economical fashion.

In accordance with this invention, a signal expressed in one code may be converted into a signal expressed in a second code by means of a matrix, whereby the first code signal is applied to the matrix input and the signal in accordance with the second code obtained from the output of the matrix. A signal expressed in accordance with the second code is convertible into a signal in accordance with the first code in the following fashion. The contents of a counter which has as many bits as that in the first code are fed into the matrix input. The output of the matrix is compared with the second code signal, by a comparator. The counter is permitted to step from a selected starting point, i.e. the reset condition, until a comparison of equality is obtained between the input signal in the second code and the output of the matrix. Upon comparison, the output of the comparator allows the contents of the counter to be gated out through a gate circuit as the desired signal in the first code. A further feature of this invention provides an error detecting bit which may be added to the counter as the next most significant bit. When the counter has exhausted all possible characters in the first code, the error detecting stage then changes its state. This change is used to operate an alarm, indicating that the signal in the second code has no corresponding signal in the first code, that the converter itself is not functioning properly, or other error. This circuit finds its greatest utility in converting from one parallel code to another parallel code. Modifications can be made, however, for conversion of serial codes.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which the sole figure is a block diagram of a reversible code converter in accordance with the invention.

Referring to the figure, there is shown a reversible code converter for converting a signal expressed in code A, of one fixed length for example, the five unit printer code, to its corresponding signal in code B, of another fixed length for example, the seven unit telegraphic code. The converter is reversible, converting signals expressed in code B to code A.

A "code A" input terminal 10 is coupled to input 12 of a unilateral code converter, such as a matrix 14. The output 16 of the matrix 14 is coupled to a "code B" output terminal 18. A "code B" input terminal 20 is coupled to one input terminal 22 of a comparator 24. The output 16 of the matrix 14 is coupled to a second input terminal 26 of the comparator 24. An inequality output 28 of the comparator 24 is coupled to a "stepping" input terminal 30 of a counter 32. An output 34 of the counter 32 is coupled to the input 12 of the matrix 14. The output 34 of the counter 32 is also coupled to one input 36 of a two-input "and" gate 38 having its second input 40 adapted to receive an output 29 of the comparator 24. The output 42 of the gate 38 is coupled to a "code A" output terminal 44. An error detecting bit stage 46 of the counter 32 is coupled to an error alarm circuit 48.

The matrix 14 is, preferably, a diode matrix. However, a matrix of magnetic cores, or the like, may be used. The matrix 14 converts a signal directly from one code to another. The matrix 14 may be the diode matrix disclosed in Patent No. 2,716,156 of Harris, entitled "Code Converter." In such case, the matrix input 12 herein corresponds to the five pairs of mark and space inputs of the Harris converter and the matrix output 16 corresponds to the seven output leads 1′ through 7′ of Harris. The comparator, counter arrangement, and matrix convert in the reverse direction. The comparator 24 may be any suitable comparator which compares the seven unit codes received at its inputs 26 and 22 and provides an equal output or an unequal output depending upon whether the two received codes are the same or different. Suitable comparators are known in the art. For example, the coincidence detector 27 of the Canfora patent, 2,744,955, referred to above may be used. In such case, the detector is provided with seven stages with each two bits of corresponding order of the two input codes received at 22 and 26 compared with each other. The output 28 of the comparator 24 corresponds to the unequal output of the Canfora coincidence detector, and like the same output of Canfora, is used to actuate a binary counter circuit. The equal output 29 herein can be derived by inverting the unequal output on lead 28. Thus, the output 28 is one level, denoting inequality, except when the two compared codes are equal. At these times the output 29 is at another level which does not enable the "and" gate circuit 28. When the compared codes are equal the output levels at 28 and 29 reverse and the counter is not triggered and the "and" gate circuit 28 is enabled to transmit the code represented by the five counter stages to the output 44. The counter 32 may be a five stage binary counter as described for either one of the counters 13 or 23 of Canfora. The five pairs of "1" and "0" outputs of the five counter stages are applied to the five pairs of inputs of the matrix 14. Here a "1" output corresponds to a "mark" signal and a "0" output corresponds to a "space" input. Additionally, a sixth counter stage 46 is used in the present invention to provide an error or "overflow" indication, as described more fully hereinafter. The outputs of the five counter stages are applied to the "and" gate circuit 38 to produce the code A output when this gate is enabled by the equal output 29 of the comparator 24. The counter 32 is reset by any suitable means prior to a seven-to-five unit code conversion. For example, the reset means described in the Canfora patent referred to above may be used. The circuitry described may be used in digital data processing systems and other systems where a bilateral code condition is desired. Although this circuit has great utility for conversion of parallel codes, modifications may be made for conversion of serial codes.

In operation, a singal, which may be in the five digit code, is applied to "code A" input terminal 10. The matrix 14 converts the input signal, expressed in the five digit code, into a signal expressed in the "code B" code, which may be a seven digit code, thereby obtaining an output at the "code B" output terminal 18. The matrix 14 converts the five digit code directly to a seven digit code. The comparator 22 and counter 32 are not used during a code A to code B conversion.

A conversion from a seven digit code to a five digit code is achieved by applying a signal expressed in the seven digit code to the "code B" input terminal 20 and obtaining the corresponding five digit code from the "code A" output terminal 44. Assuming, initially, that the counter 32 is at its starting position and that the contents of the counter 32 do not represent the coded equivalent of the input signal applied to the "code B" input terminal 20, an inequality output 28 from the comparator 24 applied to the terminal 30 steps the counter 32. In the event that the state of the counter 32 still does not represent the coded equivalent of the input signal, the comparator 24, upon receipt of the equivalent contents of the counter 32 from the matrix 14 issues another stepping pulse to the counter 32. During these periods of non-identity, no output is produced by the "and" gate 38. The output of the counter 32 is applied to one terminal 36 of the gate 38; however, there is no energizing signal present at the other input terminal 40 to provide an output from the coincidence gate 38. Upon an identity comparison of the coded equivalent of the counter 32 with the input signal at the "code B" input terminal 20, the comparator 24 ceases to step the counter 32 and provides an enabling pulse to the "and" gate 38 at its second input terminal 40. The gate 38 then opens, providing the proper signal in the five unit code at the "code A" output terminal 44. The counter can be returned to the initial reset condition by any suitable means.

In accordance with another embodiment of this invention the "and" gate may be replaced by an inhibit gate whereby the voltage level at the comparator terminal 29 provides an inhibit input to the gate 38, so that during the period of no identity comparison, a high level is applied to the input terminal 40 to inhibit the gate 38. Then, during comparison, the low level output of the comparator 24 opens the gate 38 to permit an output to occur at the "code A" output terminal 44 to represent the contents of the counter.

Other modifications may be made such as providing inhibiting levels at the counter input, providing triggering or step pulse features for the counter, providing various counter reset circuits, and the like, without departing from the spirit and scope of the invention.

If, for some reason or another, the counter 32 be stepped to its capacity without a comparison occurring in the comparator 24, an error detecting stage 46 (which may be the next most significant bit in the counter 32) changes its state and sets an alarm 48 to indicate that there is an error. This error indicates that there is a faulty connection in a circuit, or that the converter is not operating properly, or that there is no coded conversion for the particular code applied to the input terminal 20 or some other defect in operation.

Obviously, a signal may be changed from one code to another and vice versa by means of two matrices. However, to provide an additional matrix necessitates additional expensive circuitry to a computer system. Contrariwise, since many computers utilize a matrix, a comparator, counters, gates, and alarm circuits, a reversible code converter can be achieved in a computer by proper coupling, without the necessity of additional components.

The code converter circuit arrangements herein described are not limited to code systems for computers, but can be readily applied by one skilled in the art to many types of telemetering systems and communication circuits.

What is claimed is:

1. A code translator comprising a counter adapted to provide an output signal, a matrix coupled to the output of said counter, a comparator coupled to the output of said matrix, the output of said comparator being coupled to a stepping input terminal of said counter, and a coincidence gate for detecting the coincidence of a priming output from said comparator and the output signal from said counter, thereby providing an output signal code from said gate corresponding to an input signal code applied to said comparator.

2. A comparator, a counter, and a matrix coupled to said comparator and said counter, means for applying an input code to said comparator, and gating means coupled to said counter and said comparator for providing an output code corresponding to said input code.

3. A reversible code converter comprising a matrix, means for applying a signal expressed in a first code to the input of said matrix, means for obtaining an output from said matrix expressed in a second code, whereby said second code is the coded equivalent of said first code, a comparator, means for coupling the output of said matrix to an input of said comparator, means for applying a signal expressed in said second code to a second input of said comparator, a counter, means for coupling an output indicative of non-comparison from said comparator to a stepping input terminal of said counter to step the contents of said counter, the output of said counter being coupled to said matrix input, a gate circuit, means coupling the output of said counter to an input of said gate circuit, means coupling an output of said comparator to a second input of said gate to provide an output from said gate upon an identity comparison of signals at the inputs of said comparator.

4. The device as claimed in claim 3 wherein said counter provides an additional stage for indicating a non-comparison of the states of said counter with a corresponding input signal in said second code, said stage adapted to provide an output signal indicative of an error in said converter for actuating an alarm device.

5. A reversible code converter comprising a unilateral code converter for converting a signal expressed in a first code into its corresponding signal expressed in a second code, and means including feedback means coupled to said unilateral code converter for converting a signal expressed in said second code into its corresponding signal expressed in said first code.

6. A reversible code converter comprising a unilateral code converter for converting a signal expressed in a first code into its corresponding signal expressed in a second code, and means for converting a signal expressed in said second code into its corresponding signal expressed in said first code, said latter named means comprising a counter, the output of said counter being coupled to the input of said unilateral code converter, a comparator having two inputs, the output of said unilateral code coupled to an input of said comparator, the other input of said comparator adapted to receive a signal expressed in said second code, said comparator having an output terminal coupled to said counter to step said counter upon a non-identity at the inputs of said comparator, a two-input gating circuit having one input coupled to the output of said counter and having the other input coupled to an output terminal of said comparator, said comparator providing a voltage level to said coincidence gate to open said gate upon an identity comparison at the inputs of said comparator, whereby the output of said coincidence gate provides a signal expressed in said first code corresponding to the input signal expressed in said second code.

7. A reversible code converter comprising a unilateral code converter adapted to convert a signal expressed in a first code into a corresponding signal expressed in a second code, and counter means coupling the output of said unilateral code converter to the input of said unilateral code converter, whereby a signal expressed in said second code is convertible into its corresponding signal expressed in said first code.

8. A code translator comprising a comparator for comparing an input code having $n$ units with a derived code having $n$ units, a counter having $m+1$ stages where $m+1$ is less than $n$, means for applying said input code to said comparator, means including a code converting matrix for deriving an $n$ unit code from the first $m$ stages of said counter, gating means coupled to said counter and said comparator for providing an $m$ unit output code corresponding to said $n$ unit input code, and an alarm circuit for said code translator for indicating non-convertibility between said $n$ and $m$ unit codes comprising an indicator means coupled to the $m+1$th stage of said counter.

References Cited in the file of this patent

UNITED STATES PATENTS

| | | |
|---|---|---|
| 2,643,291 | Potts | June 23, 1953 |
| 2,716,156 | Harris | Aug. 23, 1955 |
| 2,744,955 | Canfora | May 8, 1956 |
| 2,814,795 | Spooner | Nov. 26, 1957 |
| 2,817,074 | Faulkner | Dec. 17, 1957 |